(12) United States Patent
Bogdanovic et al.

(10) Patent No.: US 11,774,526 B2
(45) Date of Patent: Oct. 3, 2023

(54) MAGNETOMETRY BASED ON ELECTRON SPIN DEFECTS

(71) Applicant: X Development LLC, Mountain View, CA (US)

(72) Inventors: Stefan Bogdanovic, Mountain View, CA (US); Stefan Leichenauer, Mountain View, CA (US)

(73) Assignee: X Development LLC, Mountain View, CA (US)

( * ) Notice: Subject to any disclaimer, the term of this patent is extended or adjusted under 35 U.S.C. 154(b) by 0 days.

(21) Appl. No.: 17/472,209

(22) Filed: Sep. 10, 2021

(65) Prior Publication Data

US 2022/0075013 A1 Mar. 10, 2022

Related U.S. Application Data

(60) Provisional application No. 63/076,750, filed on Sep. 10, 2020.

(51) Int. Cl.
G01R 33/32 (2006.01)
G01N 24/10 (2006.01)
G01R 33/26 (2006.01)

(52) U.S. Cl.
CPC .......... *G01R 33/323* (2013.01); *G01N 24/10* (2013.01); *G01R 33/26* (2013.01)

(58) Field of Classification Search
CPC ...... G01N 24/10; G01N 24/006; G01R 33/26; G01R 33/323; G01R 33/0076; G01R 33/022; G01R 33/032; G01R 33/60
See application file for complete search history.

(56) References Cited

U.S. PATENT DOCUMENTS

| 8,547,090 B2 | 10/2013 | Lukin et al. |
| 8,947,080 B2 | 2/2015 | Lukin et al. |

(Continued)

FOREIGN PATENT DOCUMENTS

| CN | 208125759 | 11/2018 |
| CN | 208255383 | 12/2018 |

(Continued)

OTHER PUBLICATIONS

International Search Report and Written Opinion in International Appln. No. PCT/US2021/049815, dated Dec. 22, 2021, 17 pages.

(Continued)

*Primary Examiner* — Jay Patidar
(74) *Attorney, Agent, or Firm* — Fish & Richardson P.C.

(57) ABSTRACT

A magnetometer includes a sample signal device; a reference signal device; a microwave field generator operable to apply a microwave field to the sample signal device and the reference signal device; an optical source configured to emit light including light of a first wavelength that interacts optically with the sample signal device and with the reference signal device; at least one photodetector arranged to detect a sample photoluminescence signal including light of a second wavelength emitted from the sample signal device and a reference photoluminescence signal including light of the second wavelength emitted from the reference signal device, in which the first wavelength is different from the second wavelength; and a magnet arranged adjacent to the sample signal device and the reference signal device.

40 Claims, 8 Drawing Sheets

(56) References Cited

U.S. PATENT DOCUMENTS

| | | | |
|---|---|---|---|
| 9,245,551 | B2 | 1/2016 | Hallak et al. |
| 9,541,610 | B2 | 1/2017 | Kaup et al. |
| 9,557,391 | B2 | 1/2017 | Egan et al. |
| 9,823,313 | B2 | 11/2017 | Hahn et al. |
| 9,823,314 | B2 | 11/2017 | Hahn et al. |
| 9,851,418 | B2 | 12/2017 | Wolf et al. |
| 10,006,973 | B2 | 6/2018 | Hahn et al. |
| 10,012,704 | B2 | 7/2018 | Coar |
| 10,082,545 | B2 | 9/2018 | Jeske et al. |
| 10,123,714 | B2 | 11/2018 | Hatano et al. |
| 10,126,377 | B2 | 11/2018 | Hahn et al. |
| 10,168,393 | B2 | 1/2019 | Stetson et al. |
| 10,274,551 | B2 | 4/2019 | Hruby et al. |
| 10,330,744 | B2 | 6/2019 | Luzod |
| 10,338,164 | B2 | 7/2019 | Hahn et al. |
| 10,345,396 | B2 | 7/2019 | Manickam et al. |
| 10,359,479 | B2 | 7/2019 | Manickam et al. |
| 10,379,069 | B2 | 8/2019 | Hatano et al. |
| 10,408,890 | B2 | 9/2019 | Bruce et al. |
| 10,459,041 | B2 | 10/2019 | Hahn et al. |
| 10,495,698 | B2 | 12/2019 | Jeske et al. |
| 10,502,796 | B2 | 12/2019 | Hatano et al. |
| 10,564,231 | B1 | 2/2020 | Mandeville et al. |
| 10,677,953 | B2 | 6/2020 | Stetson et al. |
| 10,712,408 | B2 | 7/2020 | Pham et al. |
| 10,753,990 | B2 | 8/2020 | Niu et al. |
| 10,816,616 | B2 | 10/2020 | Manickam et al. |
| 2016/0250481 | A1 | 9/2016 | Hess et al. |
| 2017/0328965 | A1* | 11/2017 | Hruby .................. G01R 33/26 |
| 2017/0343695 | A1 | 11/2017 | Stetson et al. |
| 2017/0356969 | A1 | 12/2017 | Ueno |
| 2019/0018076 | A1 | 1/2019 | Hahn et al. |
| 2019/0018088 | A1 | 1/2019 | Hu et al. |
| 2019/0219645 | A1 | 7/2019 | Hahn et al. |
| 2019/0235031 | A1 | 8/2019 | Ibrahim et al. |
| 2020/0049776 | A1 | 2/2020 | Wood et al. |
| 2020/0158798 | A1 | 5/2020 | Huck et al. |
| 2020/0241094 | A1 | 7/2020 | Alford |
| 2020/0281499 | A1 | 9/2020 | Maeda et al. |
| 2020/0305747 | A1 | 10/2020 | Kudo et al. |
| 2020/0347515 | A1 | 11/2020 | Markham et al. |
| 2020/0348378 | A1 | 11/2020 | Alford et al. |

FOREIGN PATENT DOCUMENTS

| | | |
|---|---|---|
| CN | 106414818 | 4/2019 |
| CN | 110133545 | 8/2019 |
| CN | 110325869 | 10/2019 |
| CN | 105223521 | 2/2020 |
| CN | 210347904 | 4/2020 |
| CN | 111175678 | 5/2020 |
| CN | 111198344 | 5/2020 |
| CN | 108983121 | 7/2020 |
| CN | 111426992 | 7/2020 |
| CN | 111568418 | 8/2020 |
| CN | 110554332 | 1/2021 |
| DE | 102018202588 | 8/2019 |
| DE | 102018208055 | 11/2019 |
| DE | 102018214617 | 3/2020 |
| DE | 102018216033 | 3/2020 |
| DE | 102018220234 | 5/2020 |
| DE | 102019203929 | 9/2020 |
| DE | 102019203930 | 9/2020 |
| EP | 3242139 | 11/2017 |
| EP | 3373023 | 9/2018 |
| GB | 2574643 | 12/2019 |
| WO | WO 2012/066527 | 5/2012 |
| WO | WO2019168097 | 9/2019 |
| WO | WO2020157497 | 8/2020 |

OTHER PUBLICATIONS

International Preliminary Report on Patentability in International Appln. No. PCT/US2021/049815, dated Mar. 23, 2023, 11 pages.

* cited by examiner

MAGNETOMETRY BASED ON ELECTRON SPIN DEFECTS

CROSS REFERENCE TO RELATED APPLICATIONS

This application claims the benefit of U.S. Provisional Patent Application No. 63/076,750, filed on Sep. 10, 2020, the entire contents of which are hereby incorporated by reference.

BACKGROUND

Various sensors are available that rely on classical physical phenomena for detecting properties such as electric or magnetic fields. In certain cases, magnetic field detectors are limited by one or more of their sensitivity, dynamic range and/or form factor.

SUMMARY

The present disclosure relates to electron spin defect based magnetometry. In some examples, the disclosure describes a magnetometer including a sample signal device; a reference signal device; a microwave field generator operable to apply a microwave field to the sample signal device and the reference signal device; an optical source configured to emit light including light of a first wavelength that interacts optically with the sample signal device and with the reference signal device; at least one photodetector arranged to detect a sample photoluminescence signal including light of a second wavelength emitted from the sample signal device and a reference photoluminescence signal including light of the second wavelength emitted from the reference signal device, in which the first wavelength is different from the second wavelength; and a magnet arranged adjacent to the sample signal device and the reference signal device.

In some implementations, the sample signal device includes a sample electron spin defect layer and the reference signal device includes a reference electron spin defect layer, each electron spin defect layer including a plurality of lattice point defects, and the light of the first wavelength excites the plurality of lattice point defects of the sample electron spin defect layer and the reference electron spin defect layer from ground states to excited states.

Examples of magnetometers may include one or more of the following features. The sample signal device includes a first substrate on which the sample electron spin defect layer is disposed, and the reference signal device includes a second substrate on which the reference electron spin defect layer is disposed. The plurality of lattice point defects includes a plurality of nitrogen-vacancy (NV) defects, and the sample electron spin defect layer and the reference electron spin defect layer each include a diamond layer including carbon 12 and/or carbon 13. The plurality of lattice point defects includes a plurality of silicon-carbide (SiC) defects. The sample electron spin defect layer and the reference electron spin defect layer each has a thickness of between about 1 micron and about 1 mm. The sample electron spin defect layer and the reference electron spin defect layer each has a thickness of between about 200 microns and about 5 millimeters. The sample electron spin defect layer and the reference electron spin defect layer each has approximately the same thickness. The microwave field generator includes patterned layers of metal positioned at one or both of a surface of the sample electron spin defect layer and a surface of the reference electron spin defect layer, and an interface of the sample electron spin defect layer with another layer of material and an interface of the reference electron spin defect layer with another layer of material.

Examples of magnetometers may also include one or more of the following features. The sample signal device is spatially separated from the reference signal device by between about 1 cm and about 10 cm. The at least one photodetector includes a first photodetector operable to detect the sample photoluminescence signal and a second photodetector operable to detect the reference photoluminescence signal. The magnetometer includes a microprocessor coupled to the at least one photodetector, the microprocessor configured to cause the at least one photodetector to detect the sample photoluminescence signal at a first time and the reference photoluminescence signal at a second time, in which the first time is different from the second time. The magnetometer includes an optical switch configured to alternately direct the light emitted by the optical source towards either the sample signal device or the reference signal device.

Examples of magnetometers may also include one or more of the following features. The magnetometer includes a microprocessor coupled to the at least one photodetector and configured to receive light measurement signals corresponding to the sample photoluminescence signal and to the reference photoluminescence signal from the at least one photodetector, and the microprocessor is configured to analyze the light measurement signals to determine characteristics of a time-dependent magnetic field to which the magnetometer is exposed. The microprocessor is configured to remove noise from a sample light measurement signal corresponding to the sample photoluminescence signal using a reference light measurement signal corresponding to the reference photoluminescence signal. The sample signal device is arranged closer to a source of the time-dependent magnetic field than is the reference signal device. The magnetometer includes a shielding element, the shielding element arranged to decrease an intensity of the time-dependent magnetic field at the reference signal device compared to an intensity of the time-dependent magnetic field at the sample signal device. Removing the noise includes subtracting the reference light measurement signal from the sample light measurement signal.

Examples of magnetometers may also include one or more of the following features. The magnet is arranged such that the sample signal device and the reference signal device are exposed to approximately the same magnitude of a magnetic field originating at the magnet. The magnetometer includes an enclosure, and the sample signal device, the reference signal device, the microwave field generator, the optical source, the at least one photodetector, and the magnet are contained in the enclosure. The enclosure is configured to attach to an article of clothing. The sample signal device is closer to the article of clothing than is the reference signal device when the magnetometer is attached to the article of clothing. The enclosure is configured to removably adhere to human skin. The sample signal device is closer to the human skin than is the reference signal device when the magnetometer is adhered to the human skin. The enclosure includes an attachment element operable to attach the enclosure to an object, and the sample signal device is closer to the attachment element than is the reference signal device. The microwave field generator includes an antenna. The microwave field generator includes a co-planar waveguide, loop, wire, or coil.

Examples of magnetometers may also include one or more of the following features. The optical source includes a light emitting diode or a laser. The first wavelength is about 532 nm. The optical source is arranged to emit the light including the first wavelength in a direction towards one or both of the sample signal device and the reference signal device. The magnetometer includes at least one optical component arranged between the optical source and the sample signal device. The at least one optical component includes at least one of a lens, a mirror, a diffraction grating, and a beam-splitter. A first photodetector of the at least one photodetector is positioned so that a detecting surface of the first photodetector faces an area of the sample signal device to which the light from the optical source is directed. The microwave field generator is positioned adjacent to an area of the sample signal device to which the light from the optical source is directed. The magnetometer includes at least one lens between the sample signal device and the at least one photodetector. The magnetometer includes at least one optical filter between the sample signal device and the at least one photodetector. The at least one optical filter is configured to filter out wavelengths of light different than the second wavelength. The magnet is a permanent magnet.

This disclosure also describes methods. In some examples, the disclosure describes a method of measuring a time-varying magnetic field using a magnetometer, the magnetometer including a sample signal device, a reference signal device, a microwave field generator, an optical source, at least one photodetector, and a magnet, the method including directing light from the optical source toward the sample signal device and toward the reference signal device, in which the light from the optical source includes light of a first wavelength; receiving, at the at least one photodetector, a sample photoluminescence from the sample signal device and a reference photoluminescence from the reference signal device, in which the sample photoluminescence and the reference photoluminescence includes light of a second wavelength different from the first wavelength; and determining a sample measurement signal due to the sample photoluminescence and a reference measurement signal due to the reference photoluminescence; and determining information about the time-varying magnetic field based on the sample measurement signal and the reference measurement signal.

In some examples, the method includes one or more of the following features. The sample signal device includes a sample electron spin defect layer and the reference signal device includes a reference electron spin defect layer, each electron spin defect layer including a plurality of lattice point defects, and directing the light includes exciting the plurality of lattice point defects of the sample electron spin defect layer and the reference electron spin defect layer from ground states to excited states. Determining the information about the time-varying magnetic field includes using the reference measurement signal to remove noise from the signal measurement signal. Removing the noise includes subtracting the reference measurement signal from the signal measurement signal. The method includes causing the at least one photodetector to detect the sample photoluminescence at a first time and the reference photoluminescence at a second time, in which the first time is different from the second time. The method includes positioning the sample signal device closer to a source of the time-varying magnetic field than is the reference signal device. The source includes a heart. The method includes applying a microwave signal to the sample signal device and to the reference signal device using the microwave field generator.

In some examples, the method also includes one or more of the following features. The method includes attaching an enclosure containing the magnetometer to an article of clothing such that the sample signal device is closer to the clothing than is the reference signal device. The method includes adhering an enclosure containing the magnetometer to skin such that the sample signal device is closer to the skin than is the reference signal device. The method includes, at a first time, directing the light from the optical source towards the sample signal device, and at a second time, different from the first time, directing the light from the optical source towards the reference signal device. The method includes using the magnet to apply an approximately equal magnetic field to the sample signal device and to the reference signal device.

The details of one or more embodiments are set forth in the accompanying drawings and the description below. Other features, objects, and advantages of the invention will be apparent from the description and drawings, and from the claims.

DETAILED DESCRIPTION

The present disclosure relates to electron spin defect based magnetometry. In particular, the present disclosure relates to techniques for sensing magnetic fields by monitoring Zeeman shifts of electron spin sublevels established by the presence of atomic defects in solid-state lattice structures, and devices for performing the same.

More specifically, electron spin defect based magnetometers include quantum sensors that leverage the occurrence of an electronic spin defect in a solid state lattice, where the spin can be both initialized and read out optically. In certain implementations, the defect may arise as an atomic-level vacancy in a lattice structure, such as a vacancy occurring near a nitrogen atom substituted in place of a carbon atom within diamond. Accordingly, a single spin defect center, as an atom-scale defect, may be used to detect magnetic fields with nanometer spatial resolution, while an ensemble of uncorrelated spin defects may be used with spatial resolution given by the ensemble size (e.g., on the order of microns) typically with an improvement in sensitivity given by $\sqrt{N}$, where N is the number of spin defects. Moreover, in some implementations, electron spin defect based magnetometers may exhibit relatively long coherence times, such as times approaching 1 second or more. Additionally, electron spin defect based magnetometers may be operated at room temperature and, in certain cases, within relatively compact structures, allow for portability and reduction in magnetometer costs, which may be advantageous in health related applications such as measuring magnetic fields emanating from the heart.

Figure 1:
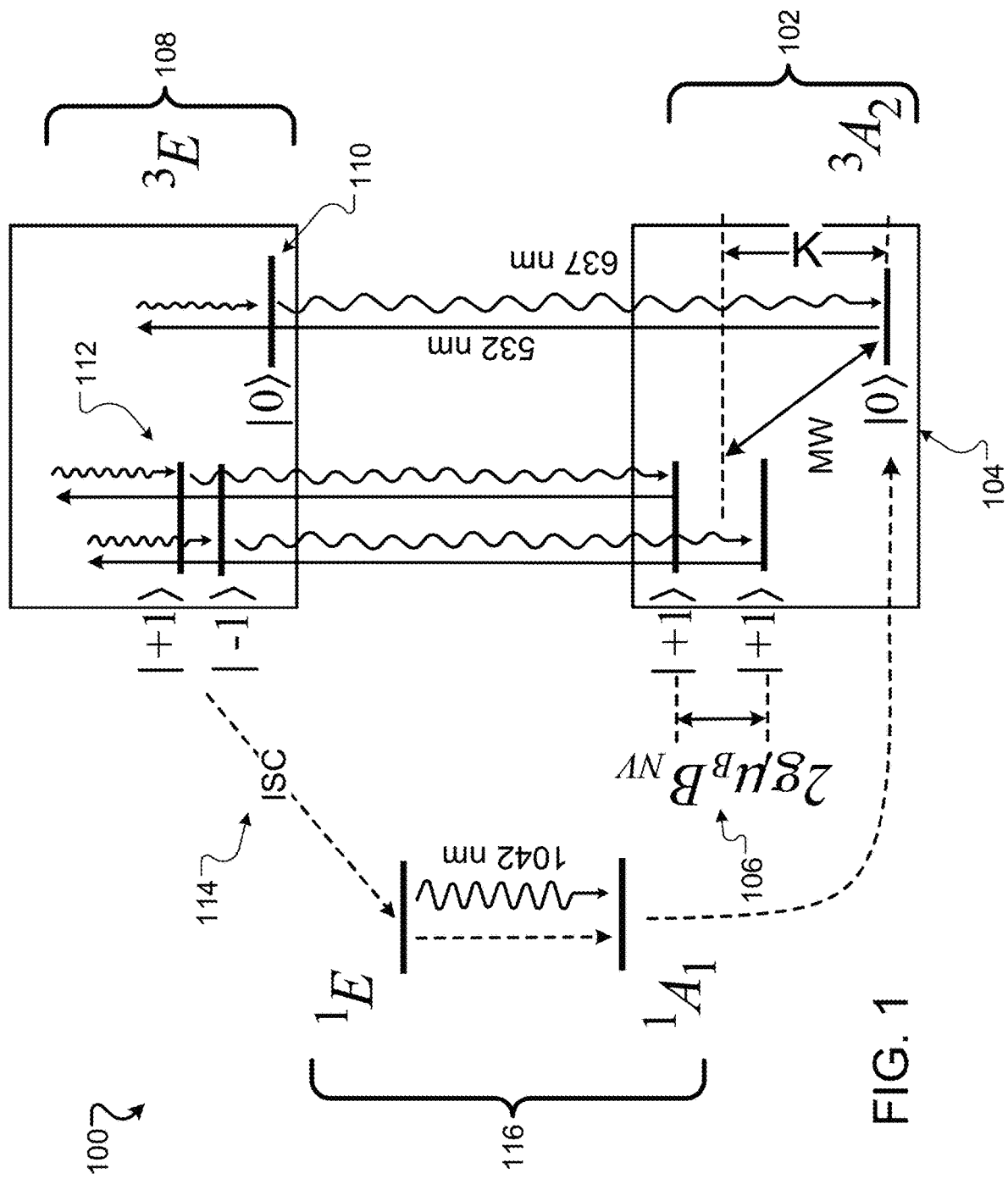
FIG. 1 is a schematic that illustrates an exemplary energy level scheme for a nitrogen-vacancy defect.

A brief description of electron spin defect based magnetometry will be described with reference to FIGS. 1-2 and in particular with respect to nitrogen vacancy (NV) magnetometry, though the techniques and devices disclosed herein may be applicable to other materials, including other types of electron spin defects, as well. An NV center is a defect in a diamond lattice that contains a substitutional nitrogen atom in place of carbon, adjacent to a vacancy in the diamond lattice. The negatively-charged state of the defect provides a spin triplet ground level which can be initialized, coherently manipulated with long coherence time and readout, using optical means. FIG. 1 is a schematic that illustrates an energy level scheme 100 for an NV defect. The NV defect behaves as an artificial atom within the diamond lattice that exhibits a broadband photoluminescence emission with a zero phonon line at 1.945 eV or $\lambda_{PL}$=637 nm. Moreover, the ground level 102 of the NV defect is a spin triplet state, having spin sub-levels of the $m_s$=0 state 104 and the $m_s$=+/−1 states 106, separated by K=2.87 GHz in the absence of a magnetic field. The defect can be optically excited to an excited level 108, which also is a spin triplet having an $m_s$=0 state 110 and $m_s$=+/−1 states 112. Once optically excited into the excited level 108, the NV defect can relax primarily through one of two mechanisms: a) through a radiative transition and phonon relaxation, thus producing a broadband red photoluminescence; or b) through a secondary path 114 that involves non-radiative intersystem crossing to singlet states 116.

The decay path branching ratios from the excited state manifold back to the ground state manifold depends on its initial spin sublevel projection. Specifically, if the electron spin began in the $m_s$=+/−1 states, there is approximately a 30% chance for the spin to decay non-radiatively through the secondary path 114, down to the $m_s$=0 state. The population of the spin sublevels can be manipulated by the application of a resonant microwave field to the diamond. Specifically, at a particular microwave frequency corresponding to the transition energy cost between the 0 and +/−1 states, transitions occur between those sublevels, resulting in a change in the level of photoluminescence of the system. In particular, if the spin is initialized into the ms=0 state, and the population is transferred to one of the +/−1 states by the resonant microwave drive, the photoluminescence rate upon subsequent optical illumination will decrease.

Figure 2:
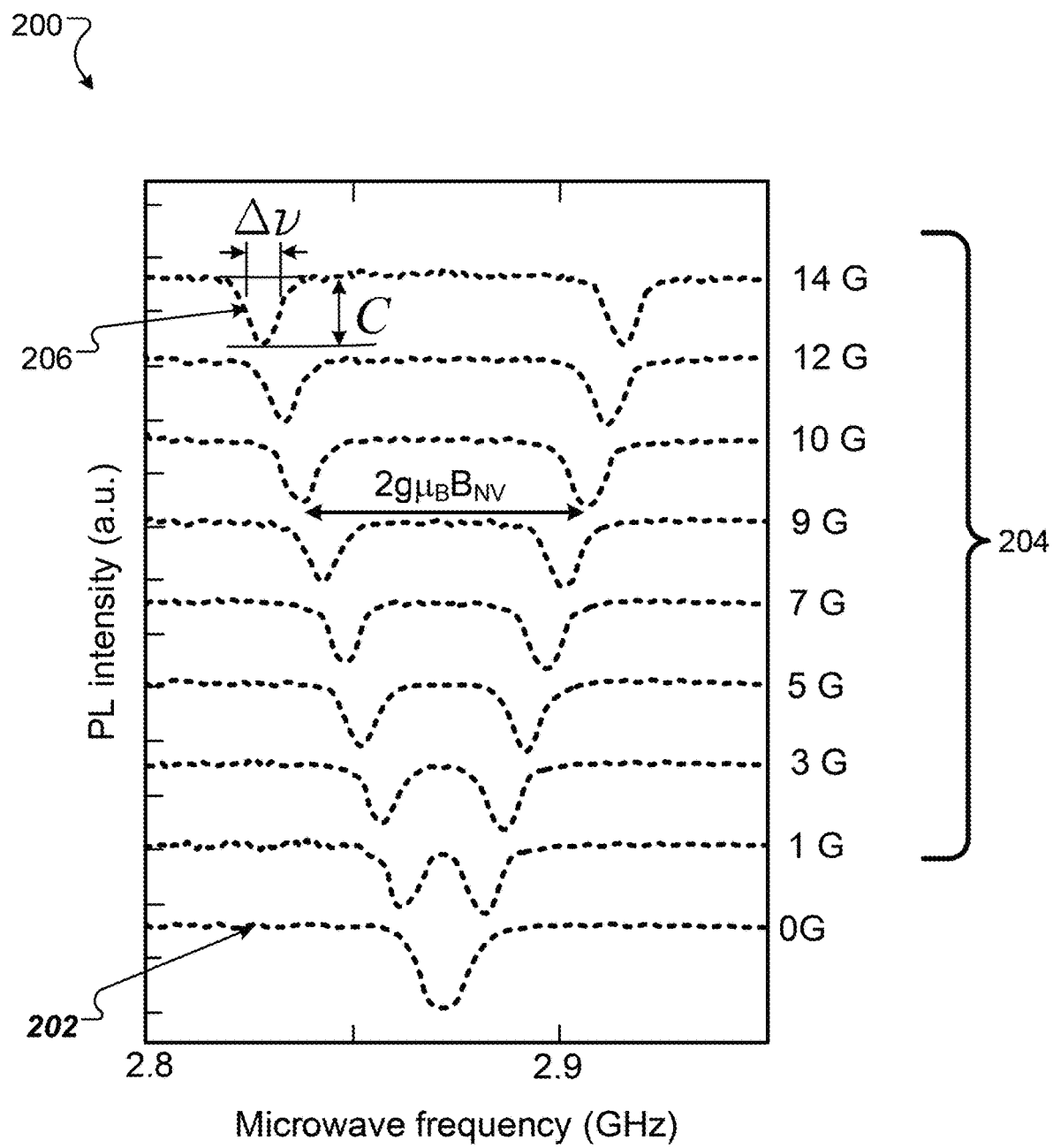
FIG. 2 is a plot of exemplary photoluminescence intensity versus applied microwave frequency.

In the absence of a magnetic field, this drop in photoluminescence may be observed by sweeping the microwave frequency, as depicted in the bottom-most photoluminescence (PL) intensity line 202 shown in FIG. 2, which is a plot of PL intensity versus applied microwave frequency. Upon applying a magnetic field in the vicinity of the NV defect, however, the degeneracy of the $m_s$=+/−1 spin sublevels is lifted by the Zeeman effect, leading to the appearance of two electron spin resonance (ESR) transitions, corresponding to dips in the PL spectrum (see upper PL lines 204 in FIG. 2). The value Δv corresponds to the ESR linewidth, typically on the order of 1 MHz and the value C is the ESR contrast. To detect small magnetic fields, the NV transitions may be driven at the point of maximum slope (see, e.g., 206 in FIG. 2). At this point of maximum slope, a time-domain change in the photoluminescence may be detected, from which a time-domain change in magnetic field can be derived. The signal may be expressed as $(\delta I_0/\delta B) \times \delta B \times \Delta t$, where $I_0$ is the NV defect PL rate, δB is the infinitesimal magnetic field variation, and Δt is the measurement duration, much smaller than the timescale on which the magnetic field changes A single NV defect therefore can serve as a magnetic field sensor with an atomic-sized detection volume. To improve sensitivity, a collective response of an ensemble of NV defects may be detected, such that the collected PL signal is magnified by the number N of the sensing spins and therefore improves the shot-noise limited magnetic field sensitivity by a factor of $1/\sqrt{N}$.

Figure 3:
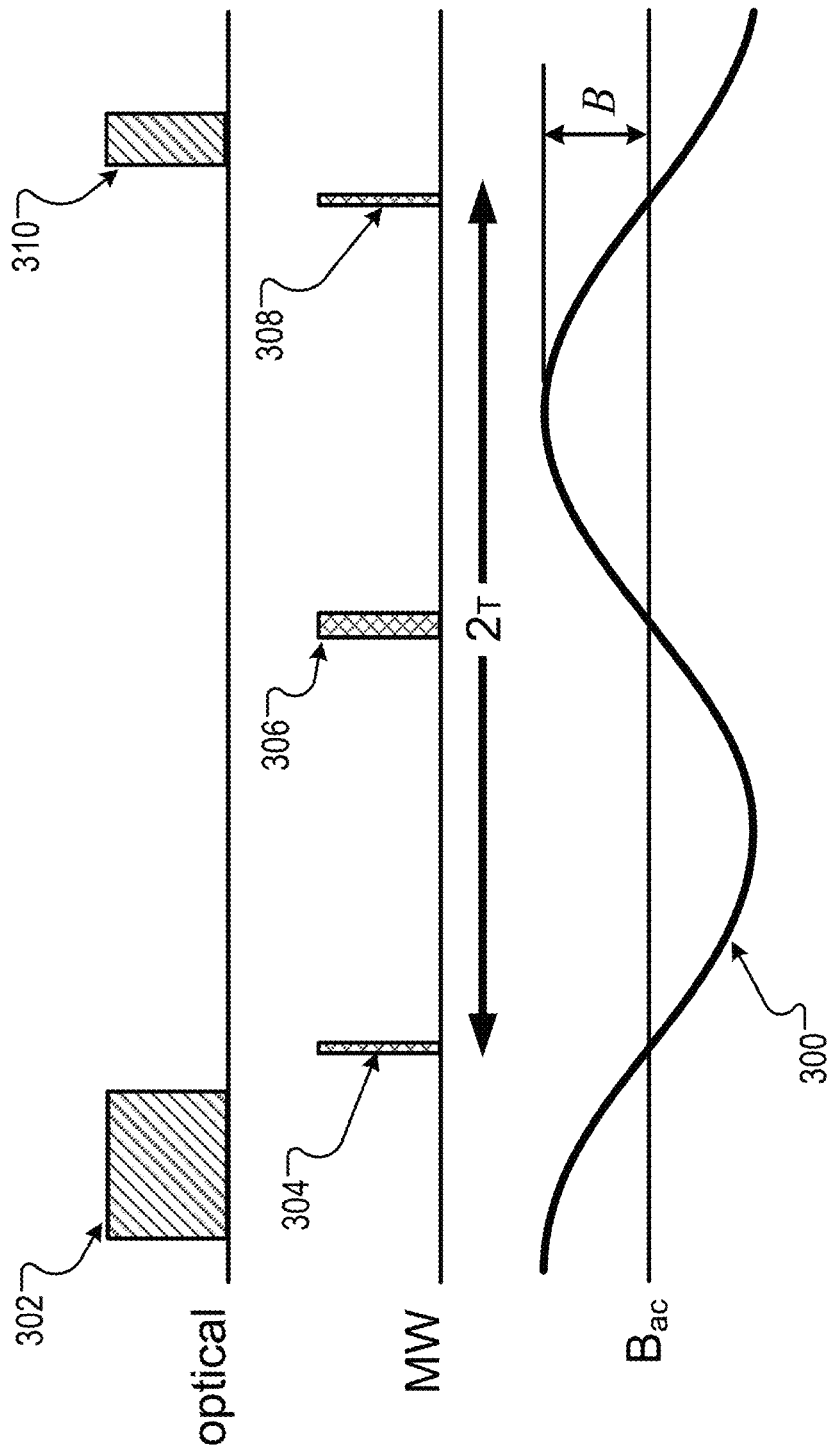
FIG. 3 is a schematic that illustrates an exemplary process for performing electron spin defect based magnetometry to detect an AC magnetic field.

Magnetic field sensitivity can further be improved if the magnetic field to be measured is periodic in time (e.g., an AC field). The improvement in sensitivity with a classical AC field is a result of a prolongation of the NV spin coherence that can be achieved through dynamical decoupling of the central spin from its environment. To avoid broadening of the ESR linewidth caused by the laser readout process and the driving microwave field, the spin manipulation, spin readout and phase accumulation (magnetic field measurement) may be separated in time. To do so, a series of microwave pulses are applied in sequence to the NV defect (or defects) that is in a prepared state |0>. Here |0> and |1> denote the electron spin states $m_s$=0 and $m_s$=1. FIG. 3 is a schematic that illustrates an example of electron spin defect based magnetometry for an AC magnetic field, in which a microwave pulse sequence is be applied to an NV defect or ensemble of NV defects. The pulse sequence may also referred to as the "Hahn echo," though other dynamical decoupling pulse sequences may be used instead. In particular, a first light pulse 302 is applied to the NV defect, or ensemble of NV defects, to place them in a prepared state |0>. While the NV defect(s) are exposed to an alternating magnetic field 300, a first π/2 microwave pulse 304, is applied to the NV defect(s) to rotate the electron spin of the NV defect(s) from the prepared state |0> to a coherent superposition $|\psi\rangle=1/\sqrt{2}*(|0\rangle+e^{i\varphi}|1\rangle)$ which evolves over a total free precession time 2τ, if the microwave drive Rabi frequency is larger than other terms in the Hamiltonian, such as NV hyperfine coupling, and the size of the magnetic field to be measured The phase φ set to zero by definition, choosing the microwave drive field to be along the y axis (arbitrary). During the free precession time, the electron spin interacts with the external magnetic field. The |1> state acquires a phase with respect to the |0> state, corresponding to a precession of the spin in the plane perpendicular to the spin quantization axis in a Bloch sphere picture. Then, a first π microwave pulse 306 is applied to "swap" the phase acquired by the |0> and |1> states. For slow components of the environmental magnetic noise, the dephasing acquired during the first half of the sequence is compensated and spin dephasing induced by random noise from the environment may be reduced. Additionally, frequency components much higher than the frequency 1/τ average out to zero. Slow components may include, e.g., DC components and low frequency components on the order of several Hz, several tens of Hz, several hundreds of Hz, and 1-1000 kHz such as 10 Hz or less, 100 Hz or less, or 500 Hz or less, 1 kHz or less, 10 kHz or less, 100 kHz or less and 1 MHz or less. In some implementations, the pulse 306 is applied at the zero crossing of the classical AC magnetic field so that the spin phase accumulation due to the classical AC field can be enhanced. In some implementations, multiple π microwave pulses 306 are applied periodically. After applying one or more π microwave pulses 306, the phase φ and thus the magnetic field is measured by applying a second π/2 pulse 308 that projects the NV electronic spin back onto the quantization axis. The total phase accumulation is thus converted into an electron population, which may be read out optically through the spin-dependent PL of the NV defect(s). That is, a second optical pulse 310 is applied to the NV defect, or ensemble of NV defects, resulting in a photoluminescence that is read out by an optical detector. To derive the magnetic field B(t) from the PL measurement, the function describing the evolution of the Sz operator under the pulse sequence is multiplied by the noise and signal fields, which is then integrated to get the phase accumulation and subsequently multiplied by contrast and total photoluminescence rate to get the photoluminescence signal (sine magnetometry). For cosine magnetometry, the filter function is convolved with the power spectral density of the noise and signal fields to get the phase variance, which is then multiplied by contrast and photoluminescence rate. Sensitivity compared to the continuous-wave driving technique may improve by a factor of at least $(T2/T2^*)^{1/2}$, in which T2 is the coherence time of the NV under AC magnetometry and T2* is inversely proportional to the NV linewidth.

As explained above, an NV defect is just one example of a type of spin defect that may be used to perform electron spin defect based magnetometry. In other implementations, one or more spin defects may be formed in silicon carbide. SiC defects include defects due to other substitutional atoms, such as, e.g. phosphorus, in the SiC lattice. Similar techniques for detecting magnetic fields as described herein with NV defects may be employed with the SiC defects.

Figure 4:
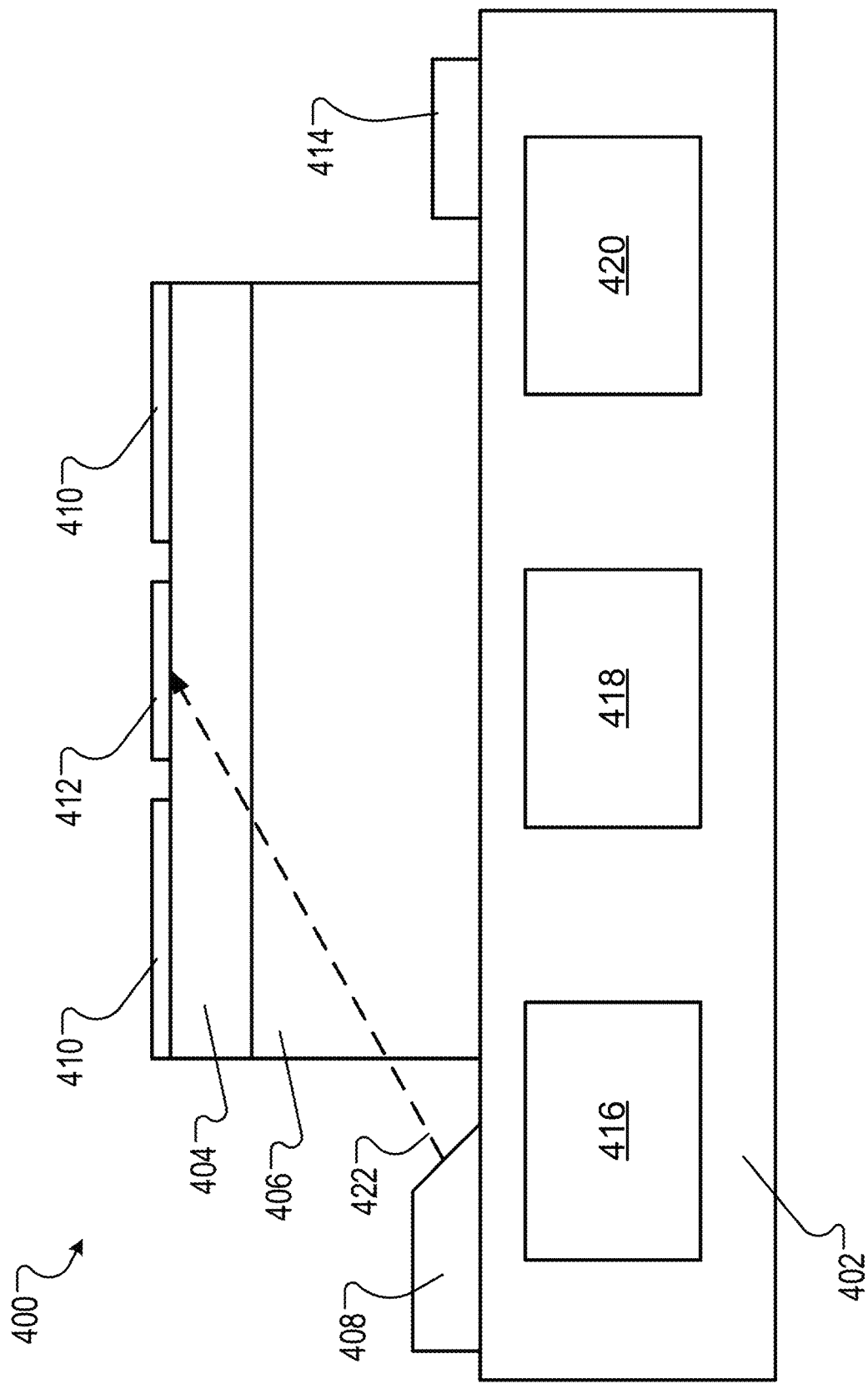
FIG. 4 is a schematic that illustrates an example of a device that may be used to perform electron spin defect based magnetometry.

FIG. 4 is a schematic that illustrates an example of a device 400 that may be used to perform electron spin defect based magnetometry, as described herein. Device 400 includes a substrate 402 and an electron spin defect layer 404 formed on the substrate 402. The electron spin defect layer 404 may include multiple lattice point defects, such as NV defects formed in diamond, as described herein. The defect layer 404 containing the NV defects may be formed, in some cases, from up to 99.999% carbon 12. In some implementations, carbon 13 may be used partially in place of carbon 12. The electron spin defect layer 404 is not limited to NV defects formed in diamond, which is typically electronic grade, and may include other lattice point defects in other materials, such as silicon carbide. The electron spin defect layer 404 may be a sub-layer of a larger layer 406 that is without the electron spin defects. For example, larger layer 406 may be a diamond layer without NV defects, whereas a top portion of the diamond layer corresponds to the defect layer 404.

The thickness of the defect layer 404 may vary. For example, in some implementations, the thickness of the defect layer 404 may be greater than about 2-3 microns, such as greater than 10 microns, greater than 50 microns, greater than 100 microns, greater than 250 microns, greater than 500 microns, or greater than 750 microns. The thickness of the defect layer 404 may be less than about 1 millimeter, such as less than 750 microns, less than 500 microns, less than 250 microns, or less than 100 microns. Other thicknesses may be used as well. Thickness of layer 404 is referenced here as being the distance from the interface between layer 404 and layer 406 and the opposite facing surface of layer 404. If the defect layer is a part of or formed on layer 406, then layer 406 may have its own separate thickness. For example, layer 406 may have a thickness between about 200 microns and about 5 millimeters. Thickness of layer 406 is referenced here as being the distance from the interface between layer 404 and layer 406 and the interface between layer 406 and substrate 402.

In some implementations, the layer 404 (or the layer 406) is secured to the substrate using an adhesive including, e.g., epoxies, elastomers, thermoplastics, emulsions, and/or thermosets, among other types of adhesives. In some implementations, electrical contacts are formed between the layer 404 (or the layer 406) and the substrate 402. For example, in some cases, the substrate may include a semiconductor material, such as silicon, in which one or more circuit elements (416, 418, 420) are fabricated. Electrical connections may be formed within the substrate 402 to provide an electrical connection between the circuit elements 416, 418, 420 and one or more components formed in or on layer 404 (or layer 406).

Device 400 further includes a microwave field generator 410 to provide a microwave field to the electron spin defects of the defect layer 404. In the present example shown in FIG. 4, microwave field generator 410 includes a thin film antenna formed on an upper surface of the defect layer 404. In some implementations, the microwave field generator 410 includes a patterned layer of metal on a surface of the defect layer 404, within layer 406 or at the interface between defect layer 404 and layer 406. The microwave field generator 410 may include a co-planar waveguide, a wire, a loop or a coil of electrically conductive material, such as metal. The microwave field generator 410 may be positioned adjacent to the area of the defect layer 404 to which the light from a spin defect excitation optical source is directed.

In some implementations, the device 404 includes a microwave field control circuit 416. The microwave field control circuit 416 may be formed in or on the substrate 402. For example, in some implementations, the control circuit 416 may be a circuit element formed within a silicon substrate. The control circuit 416 may be coupled, e.g., directly electrically connected, to the microwave field generator 410 to provide a microwave source signal to the microwave field generator 410 so that the microwave field generator 410 emits a microwave field toward the defect layer 404. The microwave source signal may optionally be a pulsed microwave source signal. In some implementations, a microwave frequency of the microwave source signal is between about 2 GHz and about 4 Ghz. In some implementations, the microwave field generator 410 emits signals at multiple frequencies spaced apart from one another to drive additional energy level splittings. For example, in some implementations, the microwave field generator 410 may be operated to emit microwave signals that address NV hyperfine transitions. In some implementations, the microwave control circuit 416 is configured to provide a control signal that generates a pulsed microwave signal at the generator 410. In some implementations, the microwave control circuit 416 is configured to provide a control signal that generates a continuous wave microwave signal at the generator 410.

In some implementations, the device 400 includes a photodetector 412 arranged to detect photoluminescence emitted from the electron spin defects of the defect layer 404. The photoluminescence may include one or more wavelengths of light, such as wavelengths of about 637 nm, corresponding to the emission wavelength of an NV defect. The photodetector 412 may be positioned on an upper surface of the defect layer 404 and in direct contact with the defect layer 404 as shown in FIG. 4. In some implementations, the photodetector 412 is positioned so that a detecting surface of the photodetector 412 faces an area of the defect layer 404 to which the light from an optical source is directed. The photodetector 412 may be secured to the defect layer 404 using an adhesive that is optically transparent to the wavelengths of light emitted by the NV defects. Alternatively, or in addition, the photodetector 412 may be formed beneath defect layer 404, such as at an interface between substrate 402 and layer 404 or within substrate 402. For example, in some implementations, the photodetector may be a silicon based photodetector formed within the substrate 402. In some implementations, an optical component is positioned between the photodetector 412 and the defect layer 404. For example, the optical component may include one or more of a lens, a beam-splitter, a diffraction grating, an optical filter, and/or a mirror. The optical filter may be configured to filter out wavelengths of light different than the wavelength of light emitted by the defects of the defect layer 404.

In some implementations, the device 404 includes a microprocessor 418, in which the microprocessor 418 is coupled to the photodetector 412 to receive a light measurement signal from the photodetector and in which the microprocessor is configured to analyze the light measurement signal to determine the characteristics of a magnetic field to which the device 404 is exposed. The microprocessor 418 may be formed in or on the substrate 402. For example, in some implementations, the microprocessor 418 may be a circuit element formed within a silicon substrate. The microprocessor 418 may be coupled, e.g., directly electrically connected, to the photodetector 412. In some implementations, the device 400 includes multiple photodetectors, such as a photodiode array. The photodetectors 412 may be located at multiple different positions around the defect layer 404 in order to maximize collection of light emitted by the defect layer 404. Though the microprocessor 418 is depicted as being formed in the substrate 402, the microprocessor may be located remotely from the magnetometer. For example, in some implementations, the magnetometer may include a transmitter/receiver to wirelessly receive control and analysis signals from the microprocessor 418 and to wirelessly transmit feedback and measurement data to the microprocessor.

In some implementations, the device 400 includes an optical source 408 configured to emit light. The light emitted by the optical source 408 may include a first wavelength that excites the one or more lattice point defects within the defect layer 404 from a ground state to an excited state. The first wavelength is different from a second wavelength that is emitted by the lattice point defects upon relaxation. The first wavelength may be, e.g., about 532 nm to excite NV defects in the defect layer 404. The optical source 408 may include, e.g., a light emitting diode, a laser, or a broadband source that includes filters configured to block transmission of wavelengths other than those used to excite the lattice point defects. The optical source 408 may be arranged to emit light 422 toward the defect layer 404. For example, the optical source 408 may be angled so that light 422 exiting the source 408 travels a path toward the defect layer 404. Alternatively, one or more optical elements may be positioned in front of the light emitted from the source 408 to redirect the light toward the defect layer 404. For example, the one or more optical components may include a lens, a mirror, a beam splitter, and/or a diffraction grating.

In some implementations, the device 404 includes an optical source circuit, i.e., a driver 420 for the optical source, in which the driver 420 is coupled to the optical source 408 to provide a control signal to drive the optical source. The driver 420 may be formed in or on the substrate 402. For example, in some implementations, the driver 420 may be a circuit element formed within a silicon substrate. The driver 420 may be coupled, e.g., directly electrically connected, to the optical source 408. In some implementations, the microprocessor 418 is coupled to one or both of the microwave field control circuit 416 and the driver 420 to control operation of the field control circuit 416 and/or the driver 420.

In some implementations, the device 400 includes a magnet 414. The magnet 414 may be arranged adjacent to the electron spin defect layer 404. The magnet 414 is provided to induce the Zeeman effect and lift the degeneracy of the $m_s=+/-1$ spin sublevels. In some implementations, the magnet 414 is a permanent magnet. In some implementations, the magnet 414 is an electromagnet. The magnet 414 may be positioned directly on the substrate 402, on layer 406, or on layer 404, among other locations. The magnet geometry may be chosen to minimize effects of inhomogeneous broadening between distinct defects in the defect layer 406.

In some implementations (e.g., some scalar magnetometry implementations), the magnet 414 is arranged such that the bias magnetic field generated by the magnet 414 aligns with spin axes of the NV defects. In some implementations (e.g., some vector magnetometry implementations), the magnet 414 is arranged so as to split PL intensity lines from the NV defects into four individual lines that together indicate all vector components of the magnetic field to be sensed.

In some implementations, during operation of the magnetometer, environmental instabilities such as laser intensity fluctuations, temperature instability, mechanical disturbances (e.g., vibrations), and/or environmental magnetic field interference may affect light measurements by the photodetector. For example, an environmental magnetic field may act alongside the time-varying magnetic field that is the object of detection (referred to herein as the sample signal), such that the sample signal cannot be independently detected.

To decrease the effects of these and other noise sources, a magnetometer, in some implementations, is configured to include or produce a reference (also referred to herein as a baseline) signal that accounts for noise in the system. In certain implementations, noise may affect both the reference signal and the sample signal in the same or substantially similar ways, such that a difference between the sample signal and the reference signal represents, mostly or wholly, magnetic field contributions from the time-varying magnetic field to be detected from the sample.

The magnetometer may be configured to include or produce a reference signal in multiple different ways. For instance, in some implementations, the magnetometer (such as magnetometer 400) includes a second defect layer in addition to the first defect layer, where the second defect layer is provided to generate the reference signal. In some implementations, the magnetometer is constructed so that the second defect layer is less sensitive to the sample signal to be detected than the first defect layer (e.g., by being positioned further from a field source of the sample signal than is the first defect layer), or is not at all sensitive to the sample signal.

Figure 5:
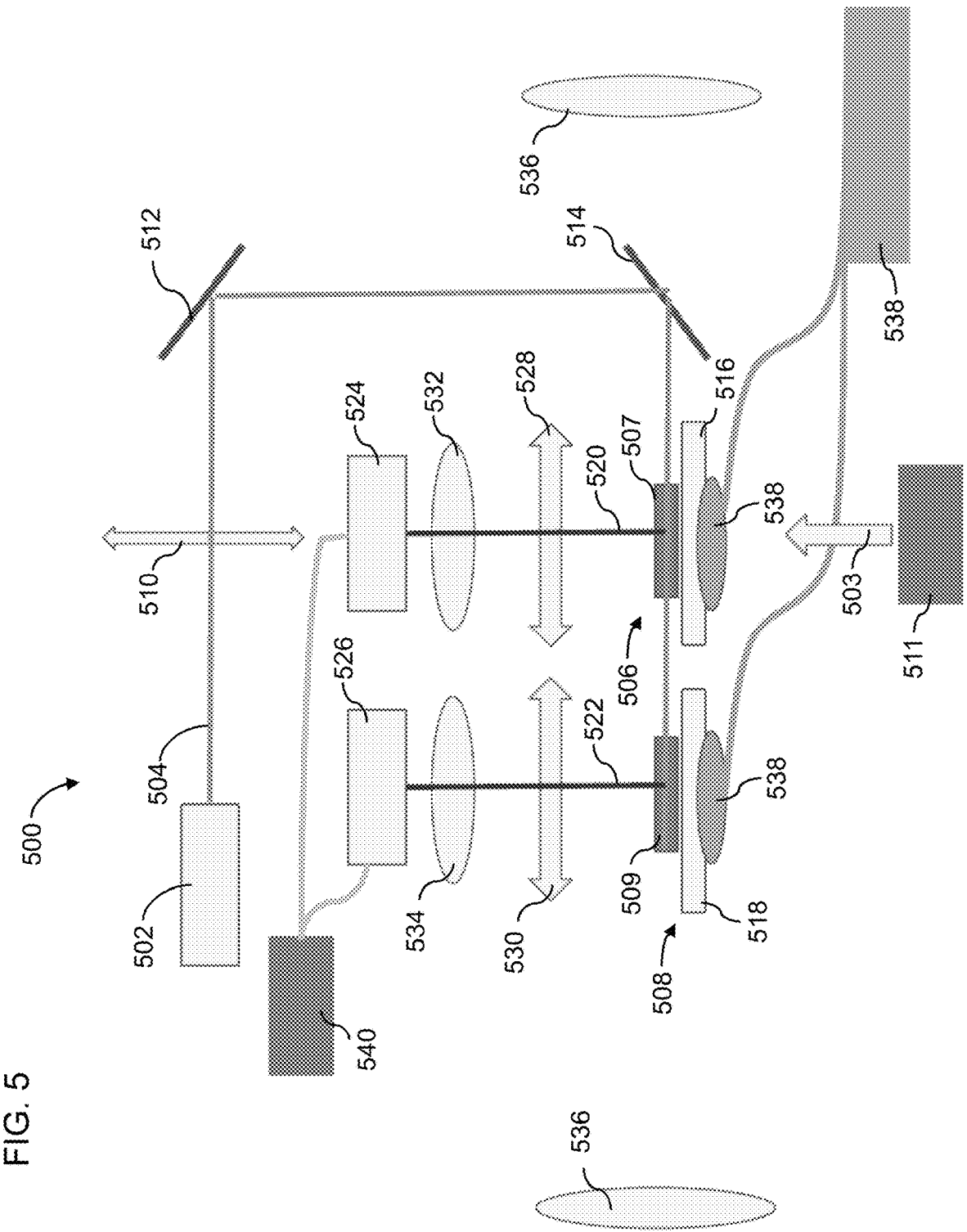
FIGS. 5-8 are schematics illustrating example magnetometers.

FIG. 5 shows an example schematic of a magnetometer 500 configured to produce a reference signal and a sample signal. Although magnetometer elements in FIG. 5 are shown schematically as discrete components, a magnetometer configured as in FIG. 5 may be implemented physically as described in reference to FIG. 4, e.g., using thin-film components partially or wholly in contact with one another.

In this example, an optical source 502 directs incident light 504 towards a sample signal device 506 and a reference signal device 508. As described above, the incident light 504 may interact with one or more optical components between the optical source 502 and the devices 506, 508; in this example, the incident light 504 passes through a focusing lens 510 and is redirected by mirrors 512, 514. The sample signal device 506 and the reference signal device 508, which may take a variety of forms, are each sensitive to magnetic fields and interact optically with the incident light 504 to generate respective photoluminescence 520, 522, as described below. The intensities of the respective photoluminescence 520, 522 are indicative of respective time-varying magnetic fields to which the respective devices 506, 508 may be exposed.

In some implementations, as shown in FIG. 5, the sample signal device 506 and the reference signal device 508 each include a respective defect layer 507, 509 (e.g., a sample electron spin defect layer 507 and a reference electron spin defect layer 509). The defect layers 507, 507 are disposed on respective substrates 516, 518 and may have some or all of the characteristics described above in reference to defect layer 404. For example, the defect layers 507, 509 may be sub-layers of respective thicker layers (not shown in FIG. 5). In some implementations, separate defect layers 507, 509 may be disposed on different portions of one substrate.

In some implementations, the defect layers 507, 509 may be configured to have approximately the same thickness (e.g., within about 1 micron, or within about 10 microns, or within about 100 microns). When the defect layers 507, 509 have approximately the same thickness, photoluminescence originating from the respective defect layers 507, 509 may be of more similar intensity, other factors being equal.

The magnetometer 500 is configured such that the sample signal device 506 is more sensitive to a time-varying magnetic field 503 emitted from a sample 511 than is the reference signal device 508. As described above, photoluminescence from the sample signal device 506 and the reference signal device 508 (e.g., from a sample electron spin defect layer and a reference electron spin defect layer) can be analyzed to determine magnetic fields felt by the sample signal device 506 and the reference signal device 508.

For example, in some implementations, as shown in FIG. 5, the sample signal device 506 is closer to the sample 511. For example, the reference signal device 508 may be between about 1 cm and about 10 cm further away from the sample 511 than the sample signal device 506. In some implementations, a magnetometer, such as magnetometer 500, includes attachment elements (e.g., straps and/or adhesives) for attachment to or close to the sample 511, and the devices 506, 508 may be positioned in reference to the attachment elements such that the devices 506, 508 have the above relative positions when the magnetometer is attached to a subject or object being observed.

In the example of FIG. 5, the incident light 504 passes through and interacts with the sample signal device 506 first, and then interacts with the reference signal device 508. In other implementations, incident light may first interact with a reference signal device 508 and then with a sample signal device 506, or incident light may be split such that separate portions of the incident light interact with the sample signal device 506 and the reference signal device 508, respectively, as described in reference to FIG. 6 below.

Photoluminescence 520, 522 emitted from devices 506, 508 (in this example, from electron spin defects of the defect layers 507, 509) is detected at photodetectors 524, 526. In various implementations, the photodetectors 524, 526 may be separate components distanced away from the respective devices 506, 508, or the photodetectors 524, 526 may be disposed, for example, on a surface of the defect layers 507, 509, as described above in reference to photodetector 412. The possible relative configurations and arrangements described for the photodetector 412 and defect layer 404 may also describe one or more photodetectors used in a magnetometer having two defect layers.

In some implementations, one or more optical components may interact with the photoluminescence before the photoluminescence is detected. For example, as shown in FIG. 5, respective optical filters 528, 530 and lenses 532, 534 are positioned on optical paths between the devices 506, 508 and the photodetectors 524, 526. The lenses 532, 534 may be configured to focus the photoluminescence 520, 522 into the photodetectors 524, 526, while the optical filters 528, 530 may be configured to block transmission of wavelengths or polarizations other than those of the photoluminescence emitted from devices 506, 508 optically interacting with the incident light 504 (e.g., the photoluminescence emitted by the electron spin defects of defect layers). For example, in some implementations, the optical filters 528, 530 are configured to block green light that pumps NV centers in the defect layers and to not block red light emitted by the NV centers.

The example magnetometer 500 also includes a magnet 536, having some or all of the characteristics described above for magnet 414. The magnet 536 may be arranged adjacent to devices 506 and 508, and, in some implementations, may be configured and/or arranged to provide approximately the same magnetic field to both devices 506, 508, such that variations in the magnetic field are felt equally at the devices 506, 508. The devices 506, 508 may be configured to have matching orientations. For example, in implementations in which the devices 506, 508 include respective defect layers 507, 509, the defect layers 507, 509 may be arranged to have matching orientations such that the magnetic field supplied by the magnet 536 is aligned with axes of electron spin defects in both defect layers 507, 509; however, in some implementations, electron spin defects in the two layers do not have aligned spins. As described above, the magnet 536 is provided to induce the Zeeman effect and lift the degeneracy of the $m_s=+/-1$ spin sublevels.

In some implementations, the example magnetometer 500 additionally includes a microwave field generator 538 configured to apply a microwave field to the devices 506, 508, as described above. The microwave field generator 538 may include respective thin-film antennas (not shown) formed on upper surfaces of the devices 506, 508, e.g., patterned layers of metal on the respective upper surfaces of respective defect layers 507, 509 or at another interface of the defect layers 509, 509. As described above for microwave field generator 410, the microwave field generator 538 may include a co-planar waveguide, a wire, a loop or a coil of electrically conductive material, such as metal, or respective numbers of these elements separately for the two devices 506, 508. The microwave field generator 538 may be positioned adjacent to areas of the devices 506, 508 to which the incident light 504 is directed. The microwave field generator 538 may be configured to apply substantially the same wavelength and/or strength of microwave field to the two devices 506, 508.

Although FIG. 5 shows a single microwave field generator 538, in some implementations separate microwave field generators may be included to deliver microwaves to separate respective devices emitting photoluminescence. For example, respective microwave field control circuits (not shown) may be formed in or on the substrates 516, 518 and coupled to respective microwave field generators to provide different respective microwave fields to the layers 507, 509. However, in some implementations, a single microwave field control circuit (formed in or on a substrate 516, 518 or in another location), may provide a matching field to both devices 506, 508. For purposes of noise reduction, it may be beneficial to include one microwave field control circuit and/or one microwave field generator providing respective microwave fields to the devices 506, 508, such that instabilities in microwave field generation and/or transmission are felt equally at the devices 506, 508.

As described above, a microprocessor 540 is coupled to the photodetectors 524, 526 and is configured to receive signals from the photodetectors 524, 526 that indicate intensities of photoluminescence received at the photodetectors 524, 526. Using the signal received from the photodetector 526 (e.g., indicating the photoluminescence emitted from the reference signal device 508) as a baseline, the microprocessor 540 is configured to remove noise from the sample signal received from the photodetector 524. For example, the microprocessor 540 may subtract the reference signal indicating the reference signal device's 508 photoluminescence intensity from the sample signal indicating the sample signal device's 506 photoluminescence intensity. The reference signal may be, for example, an electrical signal that is proportional to or otherwise indicative of the optical reference photoluminescence intensity.

As described above, because noise sources may impact both photoluminescence intensities substantially equally, while the time-sensitive magnetic field has more effect on the sample signal device's 506 photoluminescence intensity, the difference between the two photoluminescence intensities may represent a noise-reduced indicator of the time-sensitive magnetic field.

"Removing noise" from a first signal, as used in this disclosure, refers at least to generating a second signal from a first signal, the second signal being a noise-reduced version of the first signal. The noise may be only partially removed in the second signal compared to the first signal.

The microprocessor 540 may be configured to perform normalization processing on signals from the photodetectors 524, 526. For example, because, in the example of FIG. 5, the incident light 504 interacts first with the sample signal layer 506, an intensity of incident light 504 received at the reference signal device 508 may be decreased (e.g., by absorption at the sample signal device 506). Therefore, in some implementations, the microprocessor 540 may be configured to adjust (e.g., multiply by a factor greater than one) intensity signals received from the photodetector 526 to account for this decrease.

Figure 6:
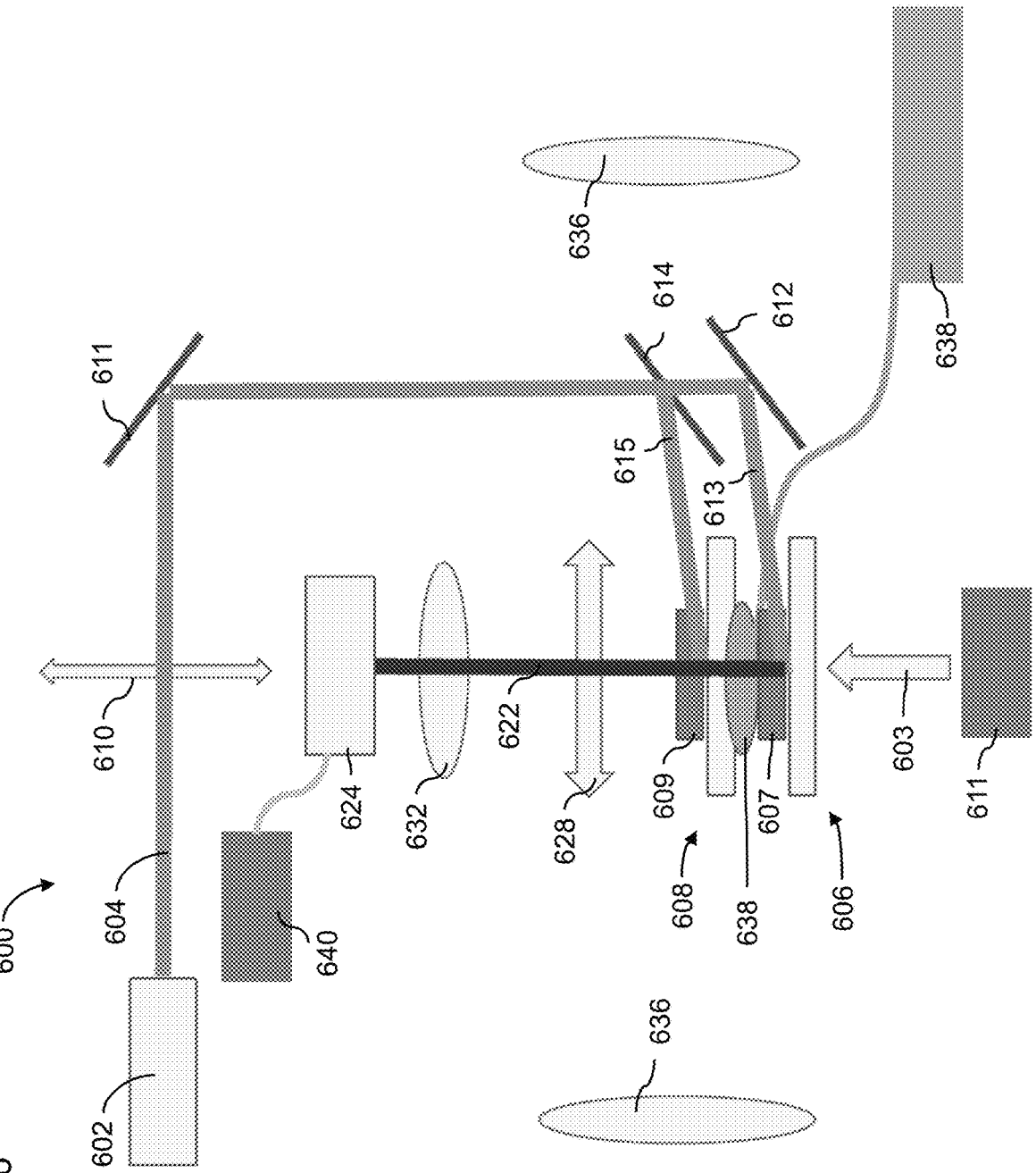

FIG. 6 shows another example of a magnetometer including a reference signal device and a sample signal device. In this example, a magnetometer 600 includes an optical source 602 emitting incident light 604. Optical components including a focusing lens 610, mirrors 611, 612, and a beamsplitter 614 divide the incident light 604 into beams 613, 615 that are directed towards a sample signal device 606 and a reference signal device 608, respectively. In this example, the sample signal device 606 includes a sample electron spin defect layer 607 and the reference signal device 608 includes a reference electron spin defect layer 609. The example magnetometer 600 also includes a lens 628, an optical filter 632, a magnet 636, and a microwave field generator 638, each having some or all characteristics described for the corresponding elements of FIG. 5.

In the example of FIG. 6, respective photoluminescence 622 from each of the sample signal device 606 and the reference signal device 608 share at least part of a common optical path, such that a photodetector 624 may detect photoluminescence 622 from both of the devices 606, 608.

In order to differentiate between the two sources of photoluminescence 622, in some implementations a microprocessor 640 coupled to the photodetector 624 may be configured to cause the photodetector 624 to perform time-resolved or time-gated detection. For example, photoluminescence detected at a first time may by emitted by the sample signal device 606, and photoluminescence detected at a second, different time may be emitted by the reference defect device 608. The time-gating may be performed based on, for example, different path lengths for light to and/or from the respective devices 606, 608. For example, the incident light 604 may be encoded (e.g., pulsed), and the detected photoluminescence 622 may be analyzed based on the encoding in order to differentiate between photoluminescence sources.

For example, in some implementations, the incident light 604 may be modulated by an optical switch. In the magnetometer of FIG. 6, for example, beamsplitter 614 may be replaced by an optical switch (e.g., an acousto-optic modulator) that alternately directs the incident light 604 either towards device 606 or towards device 608. The optical switch can be modulated significantly faster than a rate of change of the time-varying magnetic field 603.

As described in reference to FIG. 5, the magnetometer 600 is configured such that the sample signal device 606 is more sensitive to a time-varying magnetic field 603 emitted by a sample 611 than is the reference signal device 608. Photoluminescence emitted by the sample signal device 606 is therefore more strongly indicative of the time-varying magnetic field than is photoluminescence emitted by the reference defect device 608, while noise sources may affect the photoluminescences substantially equally. Based on the photoluminescences as detected by the photodetector 624, the microprocessor 640 may use the reference photoluminescence as a baseline (e.g., a noise baseline) in order to account for noise in the sample photoluminescence, and therefore may remove the noise from a signal (e.g., from the photodetector 624) indicative of the sample photoluminescence.

Although FIG. 6 shows photoluminescence from the sample signal device 606 as passing through the reference signal device 608, other configurations are possible and within the scope of this disclosure. For example, the sample signal device and the reference signal device may have alternative positions and/or orientations, such that photoluminescence from each defect layer may be collected by a lens without passing through the other device. For example, the sample signal device 606 and the reference signal device 608 may be arranged at different respective heights or displaced laterally from one another (and, in some examples, angled differently so as to both be oriented towards a lens), such that respective photoluminescence emitted by each device 606, 608 does not intersect with the other device on the optical paths of the photoluminescence to the photodetector 624. In some implementations, components of the magnetometer 600 may be configured (e.g., by positioning and/or angling) such that photoluminescence emitted by each device 606, 608 is focused onto a different respective sensing portion of the photodetector 624 (e.g., onto different portions of a charge-coupled device array).

In addition, some implementations may share features of FIG. 5 and FIG. 6. For example, in some implementations, an incident light beam may be split to separately illuminate both devices (as shown in FIG. 6), and photoluminescence from the devices may be detected by different respective photodetectors (as shown in FIG. 5).

Figure 7:
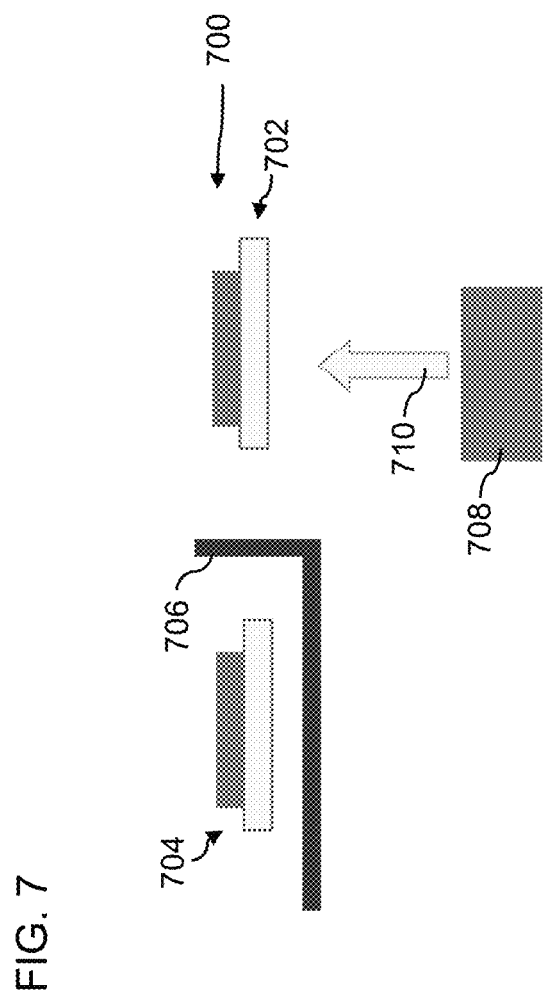

In some implementations, a magnetometer may include shielding elements (e.g., metal shields) that shield the reference signal device from the sample signal such that sample signal is comparatively weaker at the reference signal device than at the sample signal device. For example, as shown in FIG. 7, a magnetometer 700 (only partially shown in this schematic, for simplicity) includes a sample signal device 702 and a reference signal device 704, as previously described. The magnetometer 700 also includes a metal shield 706 positioned between the reference signal device 704 and a sample 708 emitting a time-varying magnetic field 710. The arrangement of the metal shield 706 between the reference signal device 704 and the sample 708 reduces a sensitivity of the reference signal device 704 to the time-varying magnetic field 710, such that the reference signal device 704 may provide a more isolated indication of noise. In some implementations, a material having high magnetic permeability is used as a shield, e.g., mu-metal.

In some implementations, the components described herein that form the magnetometer, such as the exemplary devices shown in FIGS. 4-6, may be contained within an enclosure. The enclosure may be formed from a material that allows magnetic fields to pass freely to the magnetometer within the device, such as plastic. In some implementations, the enclosure is formed from a magnetic shielding material, e.g., mu-metal, and an aperture in the magnetic shielding material, adjacent to the sample signal device 702 (and, in some implementations, the reference signal device 704) allows the time-varying magnetic field 710 to be sensed. In some implementations, the enclosure may be covered partially or entirely by a thin thermally conducting layer of material such as, e.g., aerosol, for thermal isolation. In some implementations, the enclosure containing the magnetometer may be configured to attach to an article of clothing. In some implementations, the enclosure containing the magnetometer may be configured as part of a strap, belt, or other fastener that can be secured to a body. For example, the enclosure containing the magnetometer may be secured to a person's chest. Alternatively, or in addition, the magnetometer may be placed in others structure that are affixed to a body. In some implementations, the enclosure containing the magnetometer described herein may be configured to removably adhere to human skin using, e.g., a medically adhesive tape or other medical adhesive.

Figure 8:
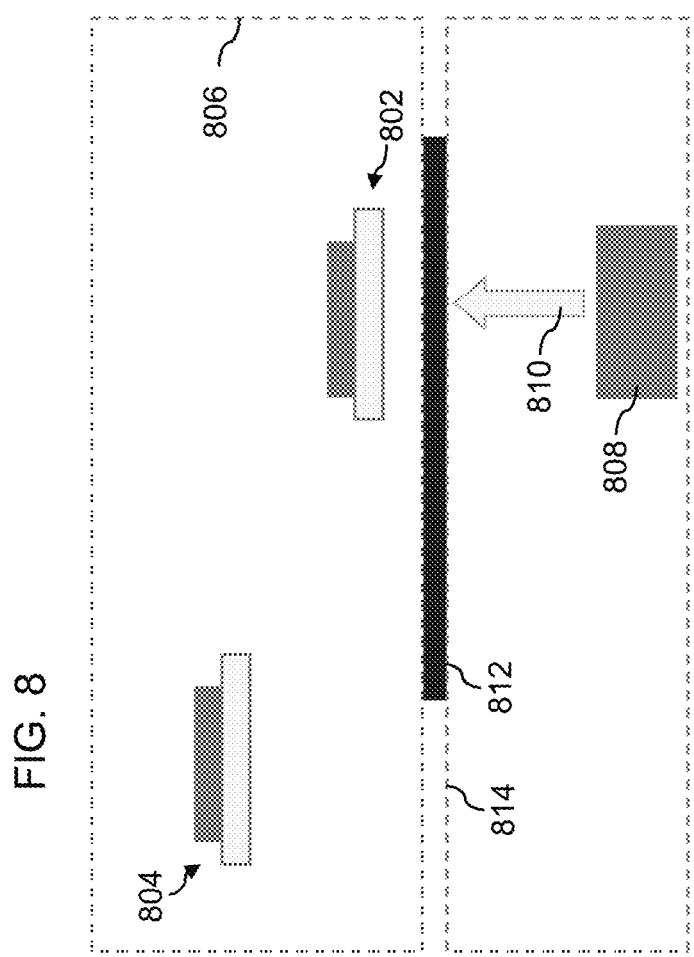

When a magnetometer is placed in an enclosure or includes an enclosure, the enclosure and magnetometer may be configured such that a sample signal device of the magnetometer is closer to a sample that emits a to-be-measured time-varying magnetic field than is a reference signal device of the magnetometer. For example, in the example of FIG. 8 (which, for simplicity, omits several features shown in FIGS. 5-6), a signal sensing device 802 and a reference signal device 804 are contained within an enclosure 806. The enclosure 806 includes an attachment element 812 (e.g., an adhesive or a clip) configured to attach the enclosure 806 to an object 814 that includes a sample 808 that is a source of a time-varying magnetic field 810. The enclosure 806, the signal sensing device 802, and the reference signal device 804 are relatively configured and arranged such that, when the enclosure 806 is attached to the object 814, the sample signal device is closer to the sample 808 that is the reference signal device 804. For example, in some implementations the sample signal device 802 is closer to a body to which the enclosure 806 is attached (e.g., closer to clothing to which the magnetometer is attached), or is closer to a portion of the body (e.g., closer to a user's heart). In some implementations, when the magnetometer is configured to removably adhere to human skin, the magnetometer and the enclosure are configured such that the sample signal device is closer to the skin. In some implementations, the sample signal device 802 is arranged closer to the attachment element 812 than is the reference signal device 804, which may result in the relative positions described.

The electron spin defect based magnetometry techniques and devices described herein are viable for compact, room temperature magnetometry, and are robust to large magnetic field variations. In some implementations, the magnetometer can be used in applications such as magnetocardiography to detect magnetic fields from the heart. In particular, compact, robust spin defect based magnetometers may be used to detect magnetic fields emanating from the heart for continuous, long-term monitoring and early detection of various cardiac conditions.

Cardiovascular disease is the number one cause of death worldwide. Electric and magnetic fields generated by the heart contain information about the onset of a dangerous condition such as a heart attack or arrhythmia. However, technologies for monitoring this vital organ may be bulky, noisy, and in non-clinical settings can only be used for up to a few days at a time, making the continuous acquisition of data over at best problematic. Moreover, current analyses must be performed by a medical professional after the data is taken, severely limiting the amount of data that can be analyzed and further increasing the cost (and decreasing the scope and accessibility) of these vital services.

The sensors required to detect the small magnetic fields tend to require operation in a shielded room (such as optically pumped magnetometers), or at cold temperatures (such as SQUIDS), making continuous acquisition and monitoring difficult. The magnetometers disclosed herein may be used, in certain implementations, as quantum sensors to measure magnetic fields from the heart and may be operated outside of a shielded room, at room temperature and offer a large dynamic range of up to 100 mT. Moreover, the device may be constructed so it is compact and can be worn comfortably and close to the body. The device may configured such that, when the device is being worn and in position on or close to the body, a sample signal device is closer to the heart than is a reference signal device.

The magnetometers described herein may also be used in applications besides magnetocardiography. For example, the magnetometers may be used to measure neuron activity. In some cases, the magnetometers may be used to detect magnetic fields created by electrical currents on a chip, thereby directly mapping on-chip circuit activity. The magnetometers described in this disclosure may be used in any application in which high-sensitive magnetic field measurement is desired.

Embodiments and functional operations described in this specification, such as the operations and analysis performed by the microprocessor, the microwave control circuit, and the optical source driver, may be implemented in digital electronic circuitry, or in computer software, firmware, or hardware, including the structures disclosed in this specification and their structural equivalents, or in combinations of one or more of them. Embodiments may be implemented as one or more computer program products, i.e., one or more modules of non-transient computer program instructions encoded on a non-transient computer readable medium for execution by, or to control the operation of, data processing apparatus. The computer readable medium may be a machine-readable storage device, a machine-readable storage substrate, a memory device, a composition of matter effecting a machine-readable propagated signal, or a combination of one or more of them.

The term "data processing apparatus" encompasses all apparatus, devices, and machines for processing data, including by way of example a programmable processor, a computer, or multiple processors or computers. The apparatus may include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) may be written in any form of programming language, including compiled or interpreted languages, and it may be deployed in any form, including as a stand-alone program or as a module, component, subroutine, or other unit suitable for use in a computing environment. A computer program does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform functions by operating on input data and generating output. The processes and logic flows may also be performed by, and apparatus may also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both.

While this specification contains many specifics, these should not be construed as limitations on the scope of the disclosure or of what may be claimed, but rather as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products A number of embodiments have been described. Nevertheless, it will be understood that various modifications may be made without departing from the spirit and scope of the invention. Accordingly, other embodiments are within the scope of the following claims.

What is claimed is:

1. A magnetometer comprising:
a sample signal device;
a reference signal device;
a microwave field generator arranged to apply a microwave field to the sample signal device and the reference signal device;
an optical source configured to emit light comprising light of a first wavelength that interacts optically with the sample signal device and with the reference signal device, wherein a first optical path of the light from the optical source to the sample signal device has a common portion with a second optical path of the light from the optical source to the reference signal device;
at least one photodetector arranged to detect a sample photoluminescence signal comprising light of a second wavelength emitted from the sample signal device and a reference photoluminescence signal comprising light of the second wavelength emitted from the reference signal device, wherein the first wavelength is different from the second wavelength; and
a magnet arranged adjacent to the sample signal device and the reference signal device.

2. The magnetometer of claim 1, wherein the sample signal device comprises a sample electron spin defect layer and wherein the reference signal device comprises a reference electron spin defect layer, each electron spin defect layer comprising a plurality of lattice point defects, and
wherein the light of the first wavelength excites the plurality of lattice point defects of the sample electron spin defect layer and the reference electron spin defect layer from ground states to excited states.

3. The magnetometer of claim 2, wherein the sample signal device comprises a first substrate on which the sample electron spin defect layer is disposed, and wherein the reference signal device comprises a second substrate on which the reference electron spin defect layer is disposed.

4. The magnetometer of claim 2, wherein the plurality of lattice point defects comprises a plurality of nitrogen-vacancy (NV) defects, and wherein the sample electron spin defect layer and the reference electron spin defect layer each comprise a diamond layer comprising carbon 12 and/or carbon 13.

5. The magnetometer of claim 2, wherein the plurality of lattice point defects comprises a plurality of silicon-carbide (SiC) defects.

6. The magnetometer of claim 2, wherein the sample electron spin defect layer and the reference electron spin defect layer each has a thickness of between about 1 micron and about 1 mm.

7. The magnetometer of claim 2, wherein the sample electron spin defect layer and the reference electron spin defect layer each has approximately the same thickness.

8. The magnetometer of claim 1, wherein the sample signal device is spatially separated from the reference signal device by between about 1 cm and about 10 cm.

9. The magnetometer of claim 1, wherein the at least one photodetector comprises a first photodetector arranged to detect the sample photoluminescence signal and a second photodetector arranged to detect the reference photoluminescence signal.

10. The magnetometer of claim 1, comprising a computer system coupled to the at least one photodetector, the computer system configured to cause the at least one photodetector to detect the sample photoluminescence signal at a first time and the reference photoluminescence signal at a second time, wherein the first time is different from the second time.

11. The magnetometer of claim 10, comprising an optical switch configured to alternately direct the light emitted by the optical source towards either the sample signal device or the reference signal device.

12. The magnetometer of claim 11, wherein the optical switch comprise an acousto-optic modulator.

13. The magnetometer of claim 1, comprising a computer system coupled to the at least one photodetector and configured to receive light measurement signals corresponding to the sample photoluminescence signal and to the reference photoluminescence signal from the at least one photodetector, and
    wherein the computer system is configured to analyze the light measurement signals to determine characteristics of a time-dependent magnetic field to which the magnetometer is exposed.

14. The magnetometer of claim 13, wherein the computer system is configured to remove noise from a sample light measurement signal corresponding to the sample photoluminescence signal using a reference light measurement signal corresponding to the reference photoluminescence signal.

15. The magnetometer of claim 14, wherein the sample signal device is arranged closer to a source of the time-dependent magnetic field than is the reference signal device.

16. The magnetometer of claim 14, wherein removing the noise comprises subtracting the reference light measurement signal from the sample light measurement signal.

17. The magnetometer of claim 1, wherein the magnet is arranged such that the sample signal device and the reference signal device are exposed to approximately the same magnitude of a magnetic field originating at the magnet.

18. The magnetometer of claim 1, comprising an enclosure, wherein the sample signal device, the reference signal device, the microwave field generator, the optical source, the at least one photodetector, and the magnet are contained in the enclosure.

19. The magnetometer of claim 18, wherein the enclosure is configured to attach to an article of clothing, and wherein the enclosure is configured such that the sample signal device is closer to the article of clothing than is the reference signal device when the magnetometer is attached to the article of clothing.

20. The magnetometer of claim 18, wherein the enclosure is configured to removably adhere to human skin, and wherein the enclosure is configured such that the sample signal device is closer to the human skin than is the reference signal device when the magnetometer is adhered to the human skin.

21. The magnetometer of claim 1, wherein the microwave field generator comprises an antenna, a co-planar waveguide, a loop, wire, or a coil.

22. The magnetometer of claim 1, wherein the first wavelength is about 532 nm.

23. The magnetometer of claim 1, wherein the optical source is arranged to emit the light comprising the first wavelength in a direction towards one or both of the sample signal device and the reference signal device.

24. The magnetometer of claim 1, comprising at least one optical component arranged between the optical source and the sample signal device.

25. The magnetometer of claim 1, comprising at least one optical filter arranged between the sample signal device and the at least one photodetector.

26. The magnetometer of claim 25, wherein the at least one optical filter is configured to filter out wavelengths of light different than the second wavelength.

27. The magnetometer of claim 1, comprising:
    a beamsplitter arranged to receive the light from the optical source and split the light from the optical source into a first portion and a second portion, wherein the first portion is directed to the reference signal device; and
    a mirror arranged to receive the second portion and direct the second portion to the sample signal device.

28. The magnetometer of claim 1, wherein the light of the second wavelength emitted from the sample signal device and the light of the second wavelength emitted from the reference signal device share at least part of a common optical path to the at least one photodetector.

29. The magnetometer of claim 1, comprising a computer system coupled to the at least one photodetector and configured to receive light measurement signals corresponding to the sample photoluminescence signal and to the reference photoluminescence signal from the at least one photodetector,
    wherein the computer system is configured to differentiate between the light measurement signals corresponding to the sample photoluminescence signal and the light measurement signals corresponding to the reference photoluminescence signal by applying time-gated detection, and
    wherein the time-gated detection is based on different optical path lengths for (i) the light from the optical source directed to the sample signal device and (ii) the light from the optical source directed to the reference signal device.

30. A method of measuring a time-varying magnetic field using a magnetometer, wherein the magnetometer comprises a sample signal device, a reference signal device, a microwave field generator, an optical source, at least one photodetector, and a magnet, the method comprising:
    directing light from the optical source toward the sample signal device and toward the reference signal device, wherein the light from the optical source comprises light of a first wavelength, and wherein a first optical path of the light from the optical source to the sample signal device has a common portion with a second optical path of the light from the optical source to the reference signal device;
    receiving, at the at least one photodetector, a sample photoluminescence from the sample signal device and a reference photoluminescence from the reference signal device, wherein the sample photoluminescence and the reference photoluminescence comprise light of a second wavelength different from the first wavelength;
    determining a sample measurement signal due to the sample photoluminescence and a reference measurement signal due to the reference photoluminescence; and determining information about the time-varying magnetic field based on the sample measurement signal and the reference measurement signal.

31. The method of claim 30, wherein the sample signal device comprises a sample electron spin defect layer and wherein the reference signal device comprises a reference electron spin defect layer, each electron spin defect layer comprising a plurality of lattice point defects, and wherein directing the light comprises exciting the plurality of lattice point defects of the sample electron spin defect layer and the reference electron spin defect layer from ground states to excited states.

32. The method of claim 30, wherein determining the information about the time-varying magnetic field comprises using the reference measurement signal to remove noise from the signal measurement signal.

33. The method of claim 32, wherein removing the noise comprises subtracting the reference measurement signal from the signal measurement signal.

34. The method of claim 30, comprising causing the at least one photodetector to detect the sample photoluminescence at a first time and the reference photoluminescence at a second time, wherein the first time is different from the second time.

35. The method of claim 34, comprising, at the first time, directing the light from the optical source towards the sample signal device, and at the second time, different from the first time, altering an optical path of the light from the optical source to direct the light from the optical source towards the reference signal device.

36. The method of claim 30, comprising positioning the sample signal device closer to a source of the time-varying magnetic field than is the reference signal device.

37. The method of claim 30, comprising applying a microwave signal to the sample signal device and to the reference signal device using the microwave field generator.

38. The method of claim 30, comprising adhering an enclosure containing the magnetometer to skin such that the sample signal device is closer to the skin than is the reference signal device.

39. The method of claim 30, comprising using the magnet to apply an approximately equal magnetic field to the sample signal device and to the reference signal device.

40. A magnetometer comprising:
a sample signal device;
a reference signal device;
a microwave field generator arranged to apply a microwave field to the sample signal device and the reference signal device;
an optical source configured to emit light comprising light of a first wavelength that interacts optically with the sample signal device and with the reference signal device;
at least one photodetector arranged to detect a sample photoluminescence signal comprising light of a second wavelength emitted from the sample signal device and a reference photoluminescence signal comprising light of the second wavelength emitted from the reference signal device, wherein the first wavelength is different from the second wavelength;
a magnet arranged adjacent to the sample signal device and the reference signal device;
a computer system coupled to the at least one photodetector, the computer system configured to cause the at least one photodetector to detect the sample photoluminescence signal at a first time and the reference photoluminescence signal at a second time, wherein the first time is different from the second time; and
an optical switch configured to alternately direct the light emitted by the optical source towards either the sample signal device or the reference signal device.

* * * * *